United States Patent [19]
Rinderle et al.

[11] Patent Number: 5,732,344
[45] Date of Patent: Mar. 24, 1998

[54] ADDITIVE HF MIXER

[75] Inventors: Heinz Rinderle; Hans Sapotta, both of Heilbronn, Germany

[73] Assignee: Temic Telefunken microelectronic GmbH, Heilbronn, Germany

[21] Appl. No.: 519,521

[22] Filed: Aug. 25, 1995

[30] Foreign Application Priority Data

Aug. 26, 1994 [DE] Germany .................. 44 30 314.9

[51] Int. Cl.$^6$ .................................. H04B 1/16
[52] U.S. Cl. .................... 455/333; 455/323; 327/356
[58] Field of Search ........................ 455/323, 326, 455/330, 333; 327/355, 356, 359, 484, 486, 361, 113

[56] References Cited

U.S. PATENT DOCUMENTS

| | | |
|---|---|---|
| 4,032,851 | 6/1977 | Hoover . |
| 4,080,573 | 3/1978 | Howell . |
| 4,090,139 | 5/1978 | Hoover . |
| 4,978,873 | 12/1990 | Shoemaker . |
| 5,039,891 | 8/1991 | Wen et al. . |
| 5,410,744 | 4/1995 | Rinderle et al. . |
| 5,584,069 | 12/1996 | Sapotta et al. .......... 455/333 |

FOREIGN PATENT DOCUMENTS

| | | |
|---|---|---|
| 0565299A1 | 10/1993 | European Pat. Off. . |
| 0631379A1 | 12/1994 | European Pat. Off. . |
| 1944081 | 3/1971 | Germany . |
| 2531603 | 4/1976 | Germany . |
| 2823789 | 12/1978 | Germany . |
| 4206164A1 | 9/1993 | Germany . |
| 1574159 | 9/1980 | United Kingdom . |
| 2261130 | 5/1993 | United Kingdom . |
| 2262851 | 6/1993 | United Kingdom . |

*Primary Examiner*—Chi H. Pham
*Attorney, Agent, or Firm*—Spencer & Frank

[57] ABSTRACT

HF mixer for changing the frequency of an alternating voltage input signal at the circuit input to an output signal supplied at the circuit output, with an input signal source for generating the alternating voltage input signal and a local oscillator for providing a heterodyne signal. The mixing stage has two transistors complementary to one another, and connected as base grounded circuits or gate grounded circuits, connected in parallel for the alternating voltage input signal. The two transistors are connected to the local oscillator in such a way that they are equidirectionally driven by the heterodyne signal, so that both transistors change simultaneously to the blocked or conductive state.

21 Claims, 2 Drawing Sheets

ADDITIVE HF MIXER

BACKGROUND OF THE INVENTION

Mixers are frequently used in circuit design, especially in order to change the frequency of an input signal to another frequency range. One main application of this is in radio engineering where an intermediate frequency (as required in superheterodyne receiver stages, for example) is generated from the HF input signal. HF mixers are designed either as additive mixing stages, in which the input signal is fed together with an oscillator signal (LO signal) to an existing non-linear characteristic and numerous mixer products are generated on account of the non-linearity, or as multiplicative mixing stages, in which real signal multiplication is performed by means of a combined circuit made up of amplifier transistors and switching transistors. Although only very few undesired mixer products are created in multiplicative mixers, they are technically very elaborate and therefore expensive to make, so that additive mixing stages are commonly used in many frequency ranges.

DESCRIPTION OF THE PRIOR ART

As a rule, additive mixing stages are made of a bipolar transistor as mixing transistor, operated as an emitter grounded circuit or as a base grounded circuit. The LO signal can be fed either to the emitter or to the base; in the latter case, less oscillator power is needed (a high oscillator power involves more current and greater technical complexity). The mixing transistor controlled by the LO signal is either active or blocked and since the load resistance is constant, this results in amplification of the LO signal at the collector. Disadvantageous is that:

- the noise of the additive mixing stage is greater and at the same time the large signal behavior is worse than is the case of an amplifier stage, so that additive mixing stages display only a low dynamic response and thus represent the weakest link in a signal transmission chain;
- in a broad-band decoupling of the output signal from the mixer, disturbance signals are generated on account of the numerous undesired mixing products and harmonics;
- the LO signal is transmitted to the input of the mixer; in the case of RF receivers, for example, this can result in the LO signal being radiated as disturbance signal through the antenna.

SUMMARY OF THE INVENTION

The object of the invention is to provide a HF mixer or mixing stage with advantageous features. This object generally is achieved according to the invention by a HF mixing stage for changing the frequency of an alternating voltage input signal (ES) injected at a circuit input (IN) to an output signal (AS) supplied at a circuit output (OUT), with an input signal source (ESQ) for generating the alternating voltage input signal (ES), and a local oscillator (LO) for producing a heterodyne signal (ÜS); and wherein: the mixing stage has two transistors ($T_1$, $T_2$) complementary to one another and connected as base grounded circuits or gate grounded circuits respectively; both transistors ($T_1$, $T_2$) are connected in parallel for the alternating voltage input signal (ES); and, the two transistors ($T_1$, $T_2$) are connected to the local oscillator (LO) such that they are driven equidirectionally by the heterodyne signal (ÜS) so as to cause the two transistors ($T_1$, $T_2$) to change to either the blocked and the conductive state simultaneously. Advantageous further developments of the invention are described.

The HF mixer presented here is designed as an additive push-pull mixing stage and has two complementary transistors operated in base grounded circuit or gate grounded circuit respectively; the transistors are arranged in such a way that in the signal branch the transistor of one polarity is connected in parallel to the transistor of the other polarity, each relating to the alternating voltage input signals. If the direct current through both transistors is identical (this can be accomplished most easily by a direct-current type of series circuit), the intermodulation products of the two transistors compensate each other. The HF mixer presented here combines several advantages:

- by the compensation of the intermodulation products, a considerable increase in linearity and thus dynamic response of the mixing stage can be achieved;
- since the LO current supplied from one of the two transistors at the collector or drain electrode is drawn off again, no LO components, or only very much weakened ones, appear at the collectors or drains; the LO components are therefore suppressed at the output of the mixing stage;
- since the oscillator signal at the bases and gates of the transistors connected in parallel is supplied in push-pull mode, it is suppressed at the input to the mixing stage so that radiation of the LO signal (through the antenna, for example) is reduced.

To drive the complementary transistors, the LO signal must be fed to their control electrode with a phase shift of 180°. This can be accomplished either by using balancing transformers or by using electronic means.

BRIEF DESCRIPTION OF THE DRAWINGS

The HF mixer for the case of bipolar transistors will be described on the basis of the drawings designated as FIGS. 1 to 4.

DESCRIPTION OF THE PREFERRED EMBODIMENTS

Figure 1:
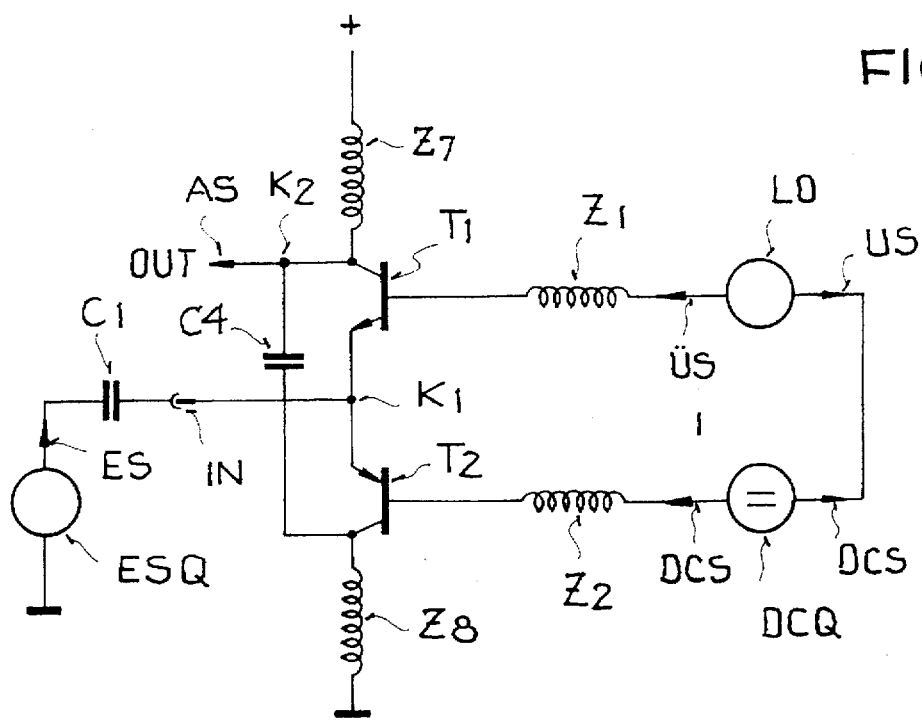
FIGS. 1 and 2 show embodiment examples in which the emitters of the two transistors operated in base grounded circuit are connected together.
Figure 2:
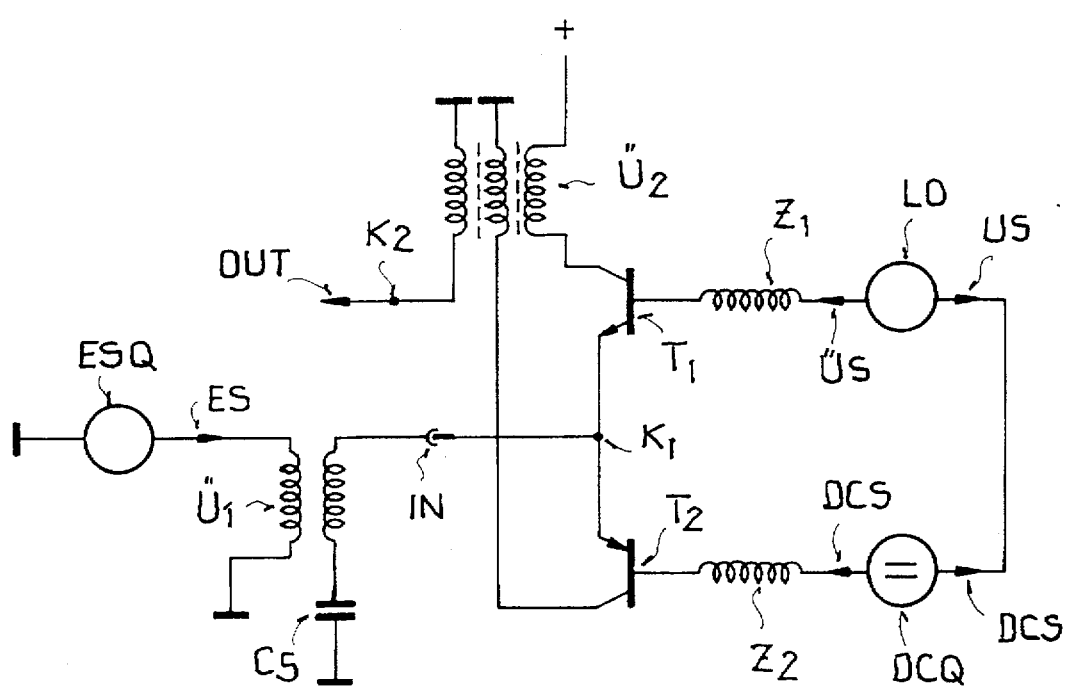

In the circuit examples of FIGS. 1 and 2, the emitters of the two bipolar transistors $T_1$ and $T_2$ are connected together at a junction $K_1$.

Coupling the input signal:

In accordance with FIG. 1, the alternating voltage input signal ES supplied from the input signal source ESQ is injected capacitively through the capacitor $C_1$ at the circuit input IN to the emitters of the two transistors $T_1$ and $T_2$ connected together at the junction $K_1$. In accordance with FIG. 2, the alternating voltage input signal ES supplied from the input signal source ESQ is injected inductively through the transformer $Ü_1$ at the circuit input IN to the emitters of the two transistors $T_1$ and $T_2$ connected together at the junction $K_1$; one terminal of the secondary winding of the transformer $Ü_1$ joined to the circuit input IN is connected to the reference potential through capacitor $C_5$.

Base drive:

The bases of the two transistors $T_1$ and $T_2$ are connected via frequency-dependent impedances $Z_1$ and $Z_2$ to the local oscillator LO that supplies the heterodyne signal ÜS and the direct voltage source DCQ that supplies the direct voltage signal DCS. The impedances $Z_1$ and $Z_2$ are selected so as to be low-ohmic for the desired mixer product (for instance $f_1-f_2$, where $f_1$ is the frequency of the input signal ES and $f_2$ the frequency of the heterodyne signal ÜS). Consequently, the difference frequency signals produced at the emitters of the transistors $T_1$ and $T_2$ are converted without loss and with little noise to output signal AS. The direct voltage signal DCS from the direct voltage source DCQ is selected so as to allow the two transistors $T_1$ and $T_2$ to switch through once in the course of one period of the heterodyne signal ÜS of the local oscillator LO.

Decoupling

In accordance with FIG. 1, the output signal AS at circuit output OUT is picked off at the summing point $K_2$ from the collectors of the two transistors $T_1$ and $T_2$ that are connected together via capacitor $C_4$. The collectors of transistor $T_1$ and transistor $T_2$ respectively are connected respectively through frequency-dependent impedances $Z_7$ and $Z_8$ to the positive and negative terminal of the supply direct voltage. The impedance $Z_7$ is selected such that it is high-ohmic for the desired mixer product (for example $f_1-f_2$) and for all other frequencies (including the frequency f=0) low-ohmic, resulting in selective amplification of the desired output signal AS (frequency $f_1-f_2$). The impedance $Z_8$ is selected such that it is high-ohmic for the desired mixer product and low-ohmic at least for the frequency f=0. The impedances $Z_7$ and $Z_8$ and thus their modes of functioning are interchangeable. In accordance with FIG. 2, the output signal AS at the circuit output OUT is picked off via the trifilar transformer Ü$_2$, the first winding of which is connected to the collector of transistor $T_1$ and the positive terminal of the supply direct voltage, and the second winding to the collector of transistor $T_2$ and the negative terminal of the supply direct voltage, and the third winding to the circuit output OUT and the negative terminal of the supply direct voltage.

The impedances $Z_1$, $Z_2$, $Z_7$ and $Z_8$ can be of the passive or electronically active type, for example in the form of resistors, capacitors, inductors or in the form of transistors, transistor circuits etc.

Figure 3:
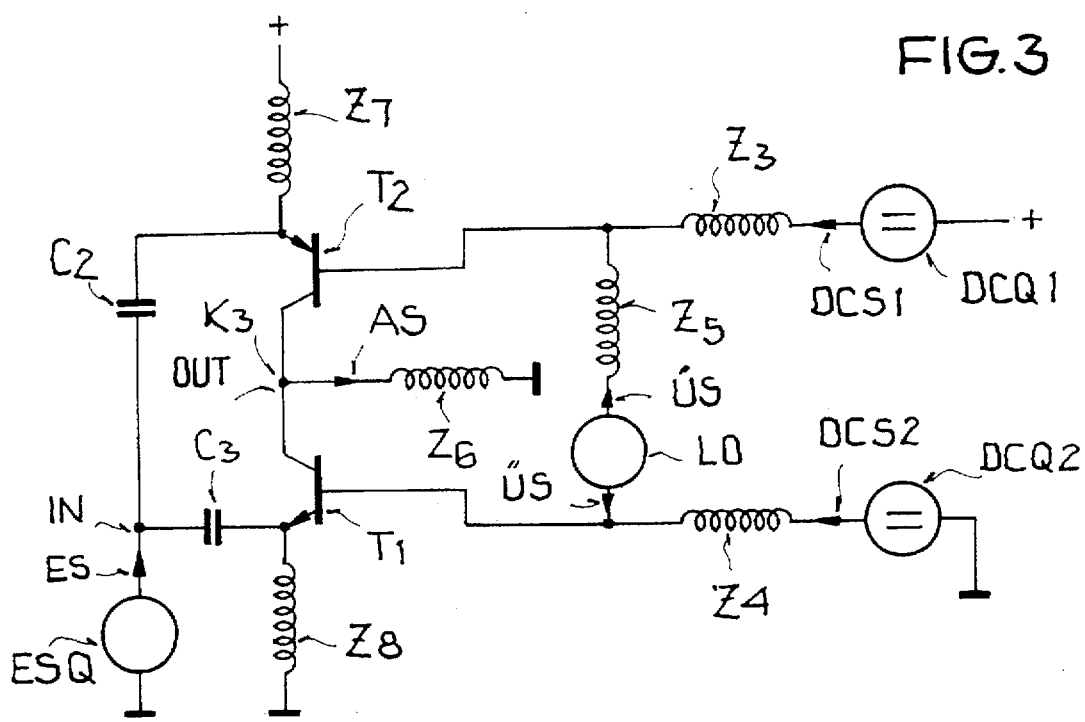
FIGS. 3 and 4 show embodiment examples in which the collectors of the two transistors operated in base circuit are connected together.
Figure 4:
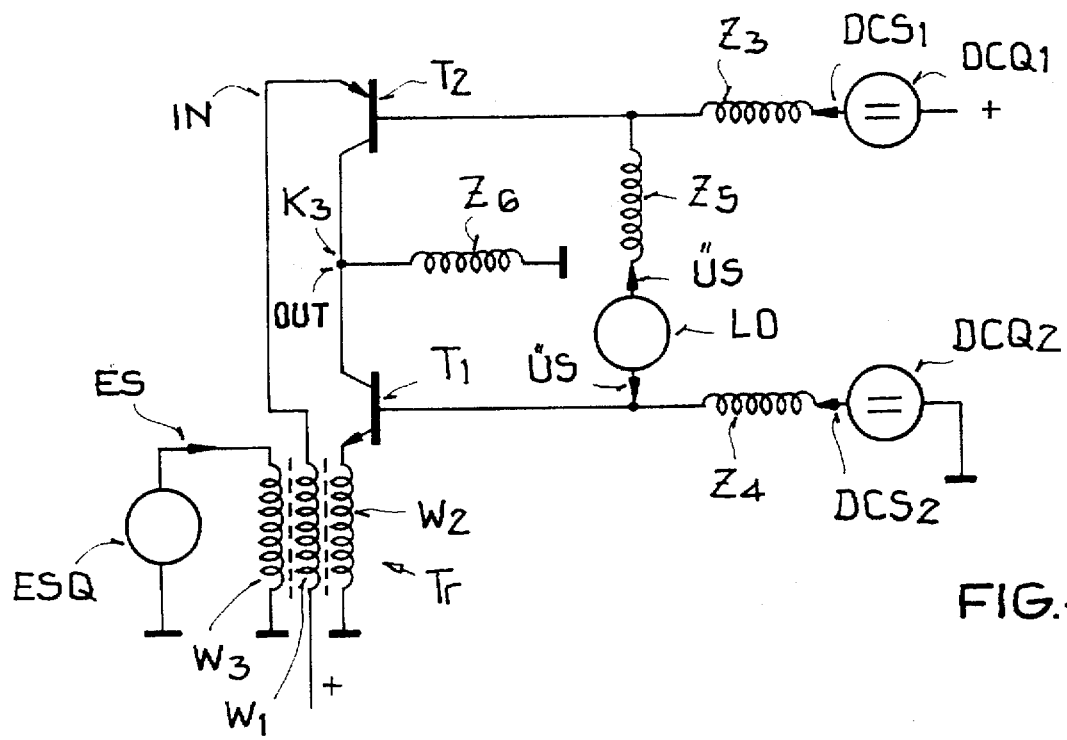

In the circuit examples of FIGS. 3 and 4, the collectors of the two bipolar transistors $T_1$ and $T_2$ are connected together at an output junction K3.

Coupling the input signal:

In accordance with FIG. 3, the input signal ES supplied from the input signal source ESQ is injected capacitively through the two capacitors $C_2$ and $C_3$ connected to circuit input IN and the emitters of the two transistors $T_1$ and $T_2$. The emitters of the transistors $T_1$ and $T_2$ are connected via frequency-dependent impedances $Z_8$ and $Z_7$ to the negative and positive terminal respectively of the supply direct voltage; the impedances $Z_7$ and $Z_8$ are selected such that the parallel circuit comprising $Z_7$ and $C_2$ with $Z_8$ and $C_3$ is low-ohmic for the desired mixer product and the impedances $Z_8$ and $Z_7$ are low-ohmic for the frequency f=0.

In accordance with FIG. 4, the input signal ES supplied from the input signal source ESQ is injected inductively through the transformer Tr with the three windings $W_1$, $W_2$ and $W_3$ to the emitters of the two transistors $T_1$ and $T_2$. The first winding $W_1$ of the transformer Tr is connected at one terminal to the positive terminal of the supply direct voltage and at the other terminal to the emitter of transistor $T_2$, the second winding $W_2$ of transformer Tr is connected at one terminal to the negative terminal of the supply direct voltage and at the other terminal to the emitter of transistor $T_1$, and the third winding $W_3$ of transformer Tr is connected at one terminal to the negative terminal of the supply direct voltage and at the other terminal to the input signal source ESQ.

Decoupling:

The output signal AS is decoupled at the output junction $K_3$ forming the circuit output OUT (where the two collectors of the transistors $T_1$ and $T_2$ are connected together) via the frequency-dependent impedance $Z_6$. The impedance $Z_6$ is selected such that it is high-ohmic for the desired mixer product and as low-ohmic as possible for all other frequencies and for the frequency f=0 as close to infinity as possible; this results in the desired output signal AS (mixer product) being amplified selectively.

Base drive:

The bases of the two transistors $T_1$ and $T_2$ are connected through the frequency-dependent impedances $Z_3$ and $Z_4$ to the direct voltage sources DCQ1 and DCQ2 that supply the direct voltage signals DCS1 and DCS2 and through the frequency-dependent impedance $Z_5$ to the local oscillator LO that supplies the heterodyne signal ÜS. The impedances $Z_3$ and $Z_4$ are selected such that, for the desired mixer product, the frequency f=0 and the desired mixer frequency (for example $f_1-f_2$) are low-ohmic and for the frequency of the heterodyne signal ÜS high-ohmic; consequently, the heterodyne signal is not short-circuited via the direct voltage sources DCQ1 and DCQ2 respectively, and the mixer product that is produced at the emitters of transistors $T_1$ and $T_2$ is transferred with little noise and at no loss to the output signal AS. The impedance $Z_5$ is selected such that it is low-ohmic for the frequency of the heterodyne signal ÜS and very high-ohmic for the frequency f=0. The direct voltage signals DCS1 and DCS2 of the two direct voltage sources DCQ1 and DCQ2 are selected such that approximately half the supply direct voltage is applied at the collector terminal of the two transistors $T_1$ and $T_2$ without heterodyne signal ÜS. The impedances $Z_3$ to $Z_8$ can be of the passive type (resistors, capacitors, inductors etc.) or of the electronically active type (transistors etc.).

What is claimed is:

1. HF mixing stage for changing the frequency of an alternating voltage input signal (ES) injected at a circuit input (IN) to an output signal (AS) supplied at a circuit output (OUT), with:

an input signal source (ESQ) for generating the alternating voltage input signal (ES);

a local oscillator (LO) for producing a heterodyne signal (ÜS); and, wherein:

the mixing stage has two transistors ($T_1$, $T_2$) complementary to one another and connected as base grounded circuits or gate grounded circuits respectively;

both transistors ($T_1$, $T_2$) are connected in parallel for the alternating voltage input signal (ES); and, the two transistors ($T_1$, $T_2$) are connected to local oscillator (LO) such that they are driven equidirectionally by the heterodyne signal (ÜS) so as to cause the two transistors ($T_1$, $T_2$) to change to either the blocked or the conductive state simultaneously.

2. Mixing stage in accordance with claim 1, wherein the two transistors ($T_1$, $T_2$) are connected in series for a supply direct voltage.

3. Mixing stage in accordance with claim 2, wherein the alternating voltage input signal (ES) is supplied in parallel to the emitter or source electrodes of the two transistors ($T_1$, $T_2$) and the output signal (AS) is picked off in parallel from the respective collector or drain electrodes of the two transistors ($T_1$, $T_2$).

4. Mixing stage in accordance with claim 1, wherein the alternating voltage input signal (ES) is supplied to the respective emitter or source electrodes of the two transistors ($T_1$, $T_2$) through circuit components ($C_1$, $C_2$, $C_3$, $Ü_1$, Tr) by capacitive or inductive coupling.

5. Mixing stage in accordance with claim 1, wherein the heterodyne signal (ÜS) is supplied to the bases of the two transistors ($T_1$, $T_2$) simultaneously with a direct voltage signal (DCQ, DCQ1, DCQ2) through circuit components ($Z_1$, $Z_2$, $Z_3$, $Z_4$, $Z_5$) for setting the bias point.

6. Mixing stage in accordance with claim 1, wherein the circuit output (OUT) is formed by a summing point or junction point ($K_2$ and $K_3$ respectively) at which the alternating currents flowing from the respective collector or drain electrodes of the two transistors ($T_1$, $T_2$) are cumulated and the output signal (AS) is picked off through circuit components ($C_4$, $Ü_2$ and $Z_6$).

7. Mixing stage in accordance with claim 1, wherein the respective emitter electrodes or source electrodes of the two transistors ($T_1$, $T_2$) are connected together at a junction ($K_1$).

8. Mixing stage in accordance with claim 7, wherein the alternating voltage input signal (ES) is supplied to the respective emitter or source electrodes of the two transistors ($T_1$, $T_2$) connected together at the junction ($K_1$) through a capacitor ($C_1$).

9. Mixing stage in accordance with claim 7, wherein the alternating voltage input signal (ES) is supplied to the respective emitter or source electrodes of the two transistors ($T_1$, $T_2$) connected together at the junction ($K_1$) through a first transformer ($Ü_1$).

10. Mixing stage in accordance with claim 8, wherein the collectors of the two transistors ($T_1$ and $T_2$) are connected to the supply voltage or to the reference potential through frequency-dependent impedances ($Z_7$ and $Z_8$).

11. Mixing stage in accordance with claim 7, wherein the output signal (AS) is picked off at a summing point ($K_2$) at which the collectors of the two transistors ($T_1$, $T_2$) are connected together through a capacitor ($C_4$).

12. Mixing stage in accordance with claim 7, wherein the output signal (AS) is picked off at a summing point ($K_2$) at which the third winding of a second transformer $Ü_2$ connecting together the collectors of the two transistors ($T_1$, $T_2$) is connected.

13. Mixing stage in accordance with claim 7, wherein the base or gate electrodes of the two transistors ($T_1$, $T_2$) are connected through frequency-dependent impedances ($Z_1$, $Z_2$) to the local oscillator (LO) and a direct voltage source (DCQ) in order to supply the direct voltage signal (DCS).

14. Mixing stage in accordance with claim 1, wherein the respective collector or drain electrodes of the two transistors ($T_1$, $T_2$) are connected together at an output junction ($K_3$) (FIG. 3, FIG. 4).

15. Mixing stage in accordance with claim 14, wherein the alternating voltage input signal (ES) applied at the circuit input (IN) is supplied in parallel to the emitter or source electrodes of the two transistors ($T_1$, $T_2$) through circuit components ($C_2$, $C_3$) for the purposes of DC isolation.

16. Mixing stage in accordance with claim 15, wherein the emitter or source electrode of the first transistor ($T_1$) is connected via a frequency-dependent impedances ($Z_8$) to the negative terminal of the supply direct voltage for the purposes of DC supply and AC isolation.

17. Mixing stage in accordance with claim 15, wherein the emitter or source electrode of the second transistor ($T_2$) is connected via a frequency-dependent impedance ($Z_7$) to the positive terminal (+) of the supply direct voltage for the purposes of DC supply and AC isolation.

18. Mixing stage in accordance with claim 14, wherein a transformer (Tr) with three windings is provided for coupling the input signal (ES), where the first winding ($W_1$) of the transformer (Tr) is connected at one pole to the emitter of the second transistor ($T_2$) and at the other pole to the positive terminal (+) of the supply direct voltage, the second winding ($W_2$) of the transformer (Tr) is connected at one pole to the emitter of the first transistor ($T_1$) and at the other pole to the negative terminal of the supply direct voltage, the third winding ($W_3$) of the transformer (Tr) is connected with one pole to the input signal source (ESQ).

19. Mixing stage in accordance with claim 14, wherein the output signal (AS) is picked off at the output junction ($K_3$) through a frequency-dependent impedance ($Z_6$).

20. Mixing stage in accordance with claim 14, wherein the base or gate electrodes of the two transistors ($T_1$, $T_2$) are connected to frequency-dependent impedances ($Z_3$, $Z_4$, $Z_5$) for the purpose of suppressing the frequency of the alternating voltage input signal (ES) and to the local oscillator (LO) and each to one direct voltage source (DCQ1, DCQ2) for the purpose of voltage supply.

21. Mixing stage in accordance with claims 10, wherein the frequency-dependent impedances ($Z_1$–$Z_8$) are provided in the form of passive or electronically active components.

* * * * *